United States Patent
Rosenthal et al.

(10) Patent No.: US 11,467,483 B1
(45) Date of Patent: Oct. 11, 2022

(54) PHOTOGRAPHIC COLOR IMAGE USING BLACK AND WHILE EMULSION

(71) Applicant: Penumbra Foundation, New York, NY (US)

(72) Inventors: Eric Rosenthal, Landenberg, PA (US); Stephen Mohn, St. Paul, MN (US); Morgan Post, Newburgh, NY (US); Eric Taubman, New York, NY (US); Geoffrey Berliner, New York, NY (US)

(73) Assignee: Penumbra Foundation, New York, NY (US)

( * ) Notice: Subject to any disclaimer, the term of this patent is extended or adjusted under 35 U.S.C. 154(b) by 0 days.

(21) Appl. No.: 17/154,933

(22) Filed: Jan. 21, 2021

Related U.S. Application Data

(60) Provisional application No. 62/964,339, filed on Jan. 22, 2020.

(51) Int. Cl.
| | |
|---|---|
| *G03F 7/00* | (2006.01) |
| *G03C 1/825* | (2006.01) |
| *G03F 7/14* | (2006.01) |
| *G03F 3/10* | (2006.01) |
| *G03F 7/40* | (2006.01) |
| *G03C 1/76* | (2006.01) |

(52) U.S. Cl.
CPC ............. *G03C 1/825* (2013.01); *G03F 3/107* (2013.01); *G03F 7/0007* (2013.01); *G03F 7/14* (2013.01); *G03F 7/405* (2013.01); *G03C 2001/7635* (2013.01); *G03C 2200/25* (2013.01)

(58) Field of Classification Search
CPC .... G03C 1/7614; G03C 1/815; G03C 1/8155; G03C 2001/7635; G03C 1/825; G03C 2200/25; G03F 7/0007
See application file for complete search history.

(56) References Cited

U.S. PATENT DOCUMENTS

| | | | |
|---|---|---|---|
| 822,532 A | 6/1906 | Lumiere et al. | |
| 4,131,464 A * | 12/1978 | Silverman | G03C 7/30 430/509 |
| 6,112,031 A * | 8/2000 | Stephenson | G03B 33/00 355/32 |
| 6,117,627 A * | 9/2000 | Tanaka | G03C 7/3029 430/138 |
| 2001/0033980 A1* | 10/2001 | Simons | G03C 7/08 430/7 |
| 2001/0038956 A1* | 11/2001 | Simons | G03C 7/08 430/7 |
| 2003/0064301 A1* | 4/2003 | Chari | G03C 7/08 430/7 |

OTHER PUBLICATIONS

Lavedrine et al.. The Lumiere Autochrome: History, Technology, and Preservation. Getty Conservation Institution, 1st Edition. pp. 114-115, 134-141, Dec. 5, 2013.

* cited by examiner

*Primary Examiner* — John S Chu
(74) *Attorney, Agent, or Firm* — McCarter & English, LLP

(57) ABSTRACT

A photographic film is formed by combining panchromatic black and white emulsion with a color filter array to produce a full color image using only black and white film and processing.

10 Claims, 4 Drawing Sheets

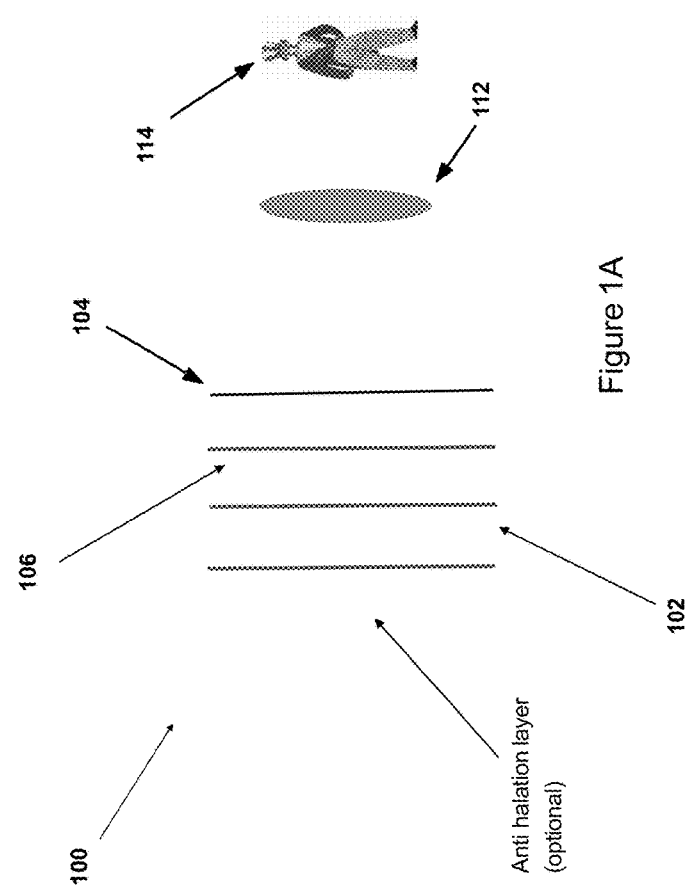
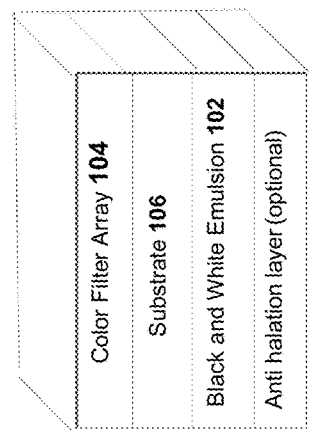
Figure 1A
Figure 1B

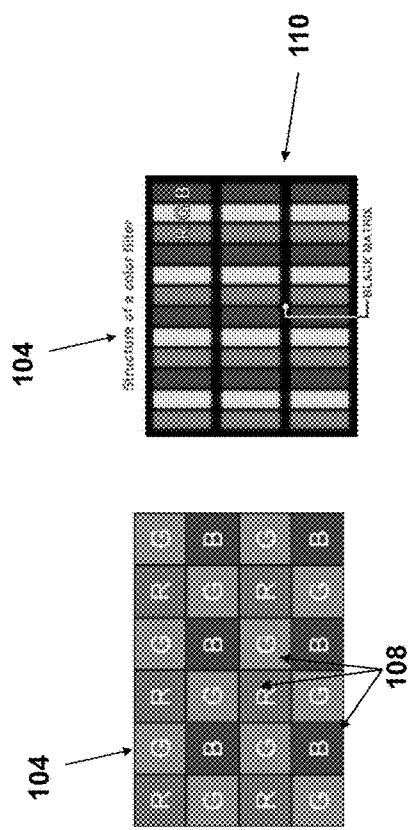
Figure 3A
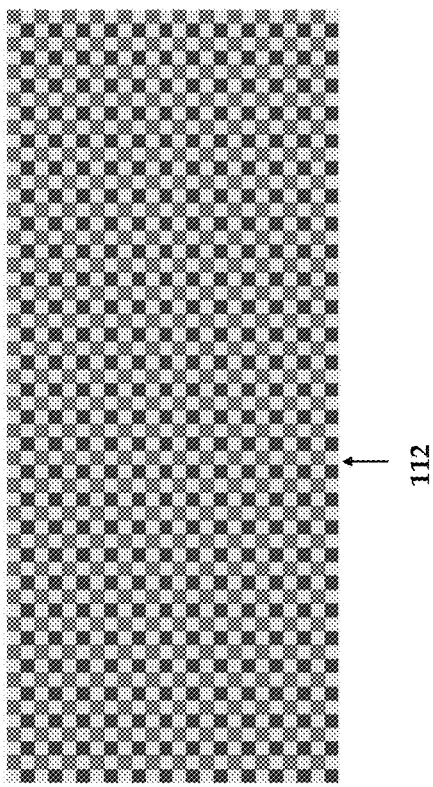
Figure 3B
Figure 3C

PHOTOGRAPHIC COLOR IMAGE USING BLACK AND WHILE EMULSION

CROSS-REFERENCE TO RELATED APPLICATIONS

This application claims priority to U.S. Provisional Application No. 62/964,339, filed Jan. 22, 2020, the entire contents of which are incorporated herein by reference in their entirety.

BACKGROUND

The Autochrome Lumière is an early color photography process. Patented in 1906 as U.S. Pat. No. 822,532A by the Lumière Brothers and first marketed in 1907, it was the principal color photography process in use before the advent of subtractive color film in the mid-1930s. Autochrome is an additive color "mosaic screen plate" process. The medium consists of a glass plate coated on one side with a random mosaic of microscopic grains of potato starch dyed red-orange, green, and blue-violet (an unusual but functional variant of the standard red, green, and blue additive colors; to compensate for the spectral response of the photographic emulsion that is used) which act as color filters. Lampblack fills the interstitial spaces between grains, and a black-and-white panchromatic silver halide emulsion is coated on top of the filter layer. [The Lumière Autochrome History, Technology, and Preservation Bertrand Lavedrine and Jean-Paul Gandolfo Getty Publications ISBN 978-1-6066-125-1 ©2013]

SUMMARY

Black and white photographic emulsions have proven to be stable for over 150 years. Silver halide based black and white photographic film will long outlast color film that use dyes. Black and white film is much less expensive to produce and process than color film and can be processed by hand by the photographer (even at home) using much less stringent processes without the need of a professional darkroom.

Embodiments of the present disclosure provide a method for fabrication of a color photographic image using black and white film which after exposure is reverse developed to form a positive transparency. The method uses a panchromatic black and white photographic emulsion layered and separated from a color filter array assembled as a laminar construct. The color filter array can be made up of spatially organized color domains, such as, but not limited to, the primary colors red, green, and blue. These color domains can be various shapes, sizes, distributions and densities organized orthogonally or randomly. An example of the spatial organization of the color domains can include circular domains assembled much like the Bayer pattern.

The interstitial regions between filter color array domains can be black for the purpose of final image contrast enhancement and control.

The color filter array can be permanently bonded to a transparent substrate. Example embodiments of the color filter array can be lithographically printed using permanent translucent dyes, vacuum vapor deposition dichroic interference filter techniques, and/or any other suitable techniques.

The substrate can be glass, flexible polymeric transparent media much like that used for conventional photographic film, or inflexible polymeric or transparent ceramic material, and/or any other suitable materials. The layering order of the overall laminar structure can be important to ensure the technical viability of the formation of color photographic transparencies based upon panchromatic black and white photographic film. According to some embodiments, color filter arrays that compensate for photographic emulsions that have correspondent spectral sensitivity variations from true panchromatic film can be used, such as, for example, infrared or ultraviolet sensitivities.

In accordance with embodiments of the present disclosure, a panchromatic black and white photographic emulsion can be applied to a filter array surface of a substrate material. The substrate along with the color filter array and the emulsion can be placed into a photographic film camera or other device to allow for the exposure of an image such that the color filter array may face the lens of the camera. Once the emulsion has been exposed, the substrate can be removed from the camera (in the dark) and the emulsion can be chemically processed using chemistry prescribed for the development, reversal processing and fixing of the panchromatic black and white emulsion that was applied to the substrate. Once the substrate has been photographically processed, the resultant image integrated onto the substrate can be viewed by holding it up to a white light source or projecting the resultant image integrated onto the substrate in a projector using a white light source. The resultant image viewed will be in full color.

Since the image is based upon a black & white photograph, which produces a full color transparency, the processing of the resultant image can be executed easily using a black and white process.

Embodiments provide a method for fabrication of a matrix that can be printed on a flexible film base that can be coated with a standard panchromatic emulsion. The technology taught herein allows for the use of several sizes including but not limited to sheet film for large format cameras, roll film for various format roll film cameras including, for example, 35 mm & medium formats and for moving image cinema cameras of various formats from 8 mm, 16 mm, 35 mm and 70 mm.

Many modern photographic films are panchromatic. As naturally prepared, silver halide emulsions are much more sensitive to blue and UV light than to green and red wavelengths. In some embodiments, a non-panchromatic emulsion can be employed, where the non-panchromatic emulsion has a sensitivity that is dominated by an inherent UV-blue sensitivity.

As described herein, embodiments of the present disclosure provide for combining panchromatic black and white emulsion with a color filter array on the same transparent media or substrate to produce a full color image positive transparency using only black and white film processing.

In accordance with embodiments of the present disclosure, a method of manufacturing a colored photographic image is provided. The method can include receiving a substrate having a panchromatic black and white photographic emulsion. In some embodiments, the panchromatic black and white photographic emulsion can be disposed on a first side thereof. In some embodiments, the panchromatic black and white photographic emulsion can have encoded therein color domain information of an image that can be exposed to the panchromatic black and white photographic emulsion through a color filter array. In some embodiments, the substrate can be processed with a reversal process to produce a positive color transparency.

In some embodiments, processing the substrate can include developing a negative image from a substrate and developing a positive image with a color filter array that may have a same spatially organized color domains as a color filter array associated with the capturing of an image via an exposure to the panchromatic black and white photographic emulsion.

In some embodiments, the reversal process can include placing the substrate in a first developer bath comprising a developing agent. In some embodiments, the developing agent can be metol, phenidone, dimezone, hydroquinone, and/or any other suitable developing agents.

In some embodiments, the reversal process can include placing a substrate in a stop bath. In some embodiments, a stop bath can comprise a solution of acetic or citric acid.

In some embodiments, the reversal process provided may include placing the substrate in a fixer bath comprising a fixer agent. In some embodiments, the fixer agent can comprise ammonium thiosulfate.

In some embodiments, the reversal process can include bleaching the substrate. In some embodiments, the reversal process can include a re-exposure process.

In accordance with embodiments of the present disclosure the substrate can have a panchromatic black and white photographic emulsion disposed on a first side of a transparent substrate and a color filter array disposed on a second side of the transparent substrate opposite to the panchromatic black and white photographic emulsion such that the transparent substrate is disposed between the panchromatic black and white photographic emulsion and the color filter array.

In some embodiments, the color filter array can have an array of primary color domains. In some embodiments, the color filter array can include ultraviolet and/or infrared domains. In some embodiments, the color domains can be arranged in a random distribution. In some embodiments, the color domains can be surrounded by a border, which can be black, colored, and/or combination of black and colored.

In some embodiments, the transparent substrate can be a type of glass. In some embodiments, the transparent substrate can be an appropriate polymer.

In some embodiments, the panchromatic black and white emulsion can be sensitive to wavelengths outside of the visible spectrum. In some embodiments, the panchromatic black and white emulsion can be sensitive to ultraviolet and/or infrared wavelengths. In one embodiment, the color filter array can consist of uniformly UV transparent human visible color dye domains to facilitate a pseudo color image of a UV illuminated scene.

In some embodiments, the color filter array can be created with inkjet printer technology. In some embodiments, the color filter array may be created with polymeric super absorbents.

In some embodiments, the color filter array can be similar to that used in LCD color displays. In one embodiment, the color filter array, where, for example, a planar substrate associated with the color domains are transparent to UV wavelengths.

In accordance with embodiments of the present disclosure, panchromatic black and white emulsion can be exposed through an optically aligned or registered color filter array that can be separated from the panchromatic black and white emulsion to produce a full color image positive transparency using only the color filter array and black and white film processing.

In accordance with embodiments of the present disclosure, the color balance of the color filter array can be modified to correct for any imbalance of color sensitivity of the panchromatic black and white photographic emulsion.

In accordance with embodiments of the present disclosure, the color balance of the color filter array can be modified to simulate the color balance of legacy color film type such as Kodachrome™, Ektachrome™, Sensia™, and/or Velvia™.

In accordance with embodiments of the present disclosure, the colors chosen for the color filter array can be selected to increase the spectral reproduction of the image beyond the ability of red green blue primaries. Additional colors, yellow, orange, cyan, and/or purple, can be added to the color filter array to increase the color rendition.

In accordance with embodiments of the present disclosure, the color filter array can be randomized to remove any moiré artifacts due to uniformly structured array patterns. In accordance with embodiments, the color filter array domains can be of different sizes to revise the dynamic range or clarity of the captured and processed image.

BRIEF DESCRIPTION OF THE DRAWINGS

The foregoing features of embodiments will be more readily understood by reference to the following detailed description, taken with reference to the accompanying drawings, in which:

FIG. 1A-B show a photographic film in accordance with an exemplary embodiment of the present disclosure.

FIG. 3A-C show depictions of exemplary color filter arrays in accordance with an exemplary embodiment of the present disclosure.

DETAILED DESCRIPTION

Figure 2:
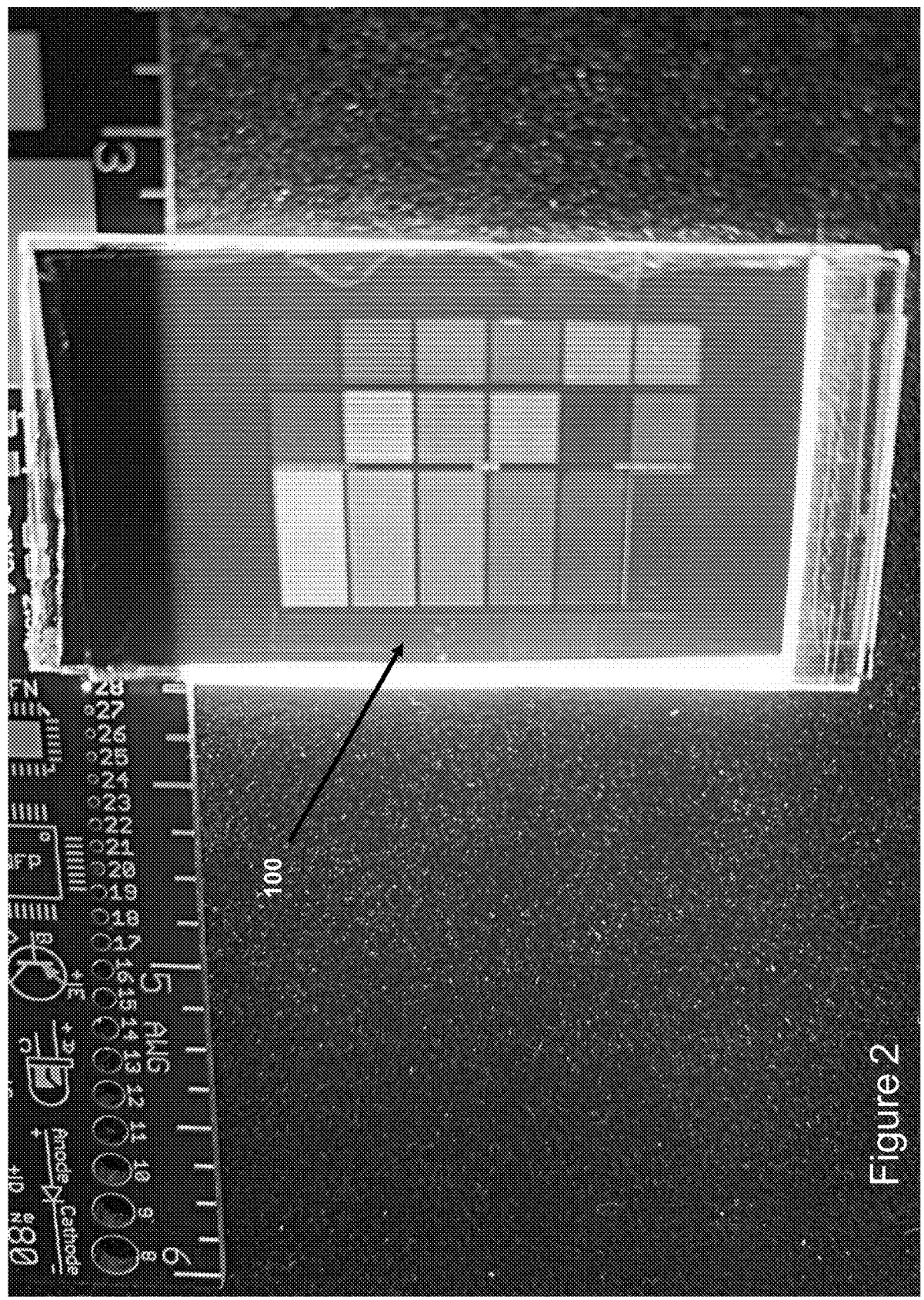
FIG. 2 shows a resultant color image by holding the substrate up to a white light source in accordance with an exemplary embodiment of the present disclosure.

Exemplary embodiments of the present disclosure relates to a photographic film and methods associated with forming the photographic film, as well as, associated methods with processing the photographic film after exposure of the film to light (e.g., when imaging a scene or subject). Embodiments of the photographic film can be fabricated to include a black and white photographic emulsion that can be encoded with color information via a color filter array upon being exposed to light through the color filter, such that the panchromatic black and white photographic emulsion can be processed to form a color photographic image in conjunction with the color filter.

As used herein, black and white or monochrome refers to a single channel of luminance which consists of shades of gray tone from dark (black) to light (white) and which is devoid of colors such as, for example, primary colors green, red, and blue or a combination thereof.

As used herein panchromatic black and white photographic emulsion is a type of photographic emulsion that is sensitive to all wavelengths of visible light, and which conventionally produces a black and white image.

As used herein non-panchromatic black and white photographic emulsion is a type of photographic emulsion that has different sensitivities to different wavelengths of light.

As illustrated in FIGS. 1A-B, a color photographic image can be fabricated from an exposed photographic film 100 using black and white film chemistry, where the photographic film 100 includes a black and white emulsion 102 and a color filter array 104. In some embodiments, the black and white emulsion can be a panchromatic black and white emulsion. In some embodiments, the black and white emulsion can be a non-panchromatic black and white emulsion. The black and white photographic emulsion 102 can have encoded therein color domain information of an image captured through a color filter array 104. As an example, in exemplary embodiments, the black and white photographic emulsion 102 of photographic film 100 can be disposed on a first side of a substrate 106. In some embodiments, the black and white photographic emulsion 102 can be wet plate or dry plate collodion silver halide based emulsions.

In some embodiments, the substrate 106 can be transparent. In one embodiment, the substrate 106 can be any type of glass, or flexible transparent media much like that used on conventional photographic film such as (polyethylene terephthalate (PET) (Kodak trade-name: ESTAR)).

The color filter 104 array can be disposed on or integrally formed with the substrate 106. As one example, the black and white photographic emulsion 102 can be disposed on one side of the substrate (a first side) and the color array filter 104 can be disposed on the opposite side (a second side) of the substrate 106. As another example, the color filter array 104 can be disposed on one side of the substrate and the panchromatic black and white photographic emulsion 102 on the same side of the substrate as the color filter array. As another example, the substrate 106 can be formed to include the color filter array 104 as a single integrated structure and the panchromatic black and white photographic emulsion 102 can be disposed on one side of the substrate. As another example, the color filter array 104 can be a separate structure apart from the substrate 106 that can be disposed proximate to the substrate (e.g., between the film and a lens of a camera).

The panchromatic black and white photographic emulsion 102 of the photographic film 100 can be processed with a reversal process to produce a positive color transparency. In some embodiments, the photographic film 100 can include an anti-halation layer 114 to prevent or mitigate refraction of light from the rear of the photographic film 100.

In some embodiments, the developer bath can convert a latent image on the photographic emulsion to microscopic particles of metallic silver. In some embodiments, a stop bath can be used to stop the action of the developing agents. In some embodiments, the stop bath may comprise a dilute solution of acetic acid or citric acid. In some embodiments, a rinse with clean water can be substituted for the stop bath. In some embodiments, a fixer bath can be used to make the image on the photographic film permanent and light-resistant by dissolving remaining silver halide of the photographic emulsion. In some embodiments, the fixer bath can comprise ammonium thiosulfate. In some embodiments, washing the image in clean water can remove any remaining fixer. Residual fixer can corrode the silver image, leading to discoloration, staining and fading. In some embodiments, the washing time can be reduced and the fixer may be more completely removed in a hypo clearing agent. In some embodiments, the photographic film may be rinsed in a dilute solution of a non-ionic wetting agent to assist uniform drying, which can eliminate drying marks caused by hard water. In some embodiments, the photographic film can be dried in a dust-free environment, cut and placed into protective sleeves. Once the photographic film is processed, the photographic film is then referred to as a negative.

In some embodiments, for black and white reversal processing, there can be three additional steps. In some embodiments, following the stop bath, the photographic film can be bleached to remove the developed negative image. The photographic film can then contain a latent positive image formed from unexposed and undeveloped silver halide salts in the photographic emulsion. Once re-exposed to light, the remaining silver halide salts of the photographic emulsion can be developed in a second developer, converting them into the positive image. In some embodiments, the photographic film may be fixed, washed, dried and cut.

Color film is more expensive than processing black and white photographic film and requires additional chemicals.

Exemplary embodiments of the present disclosure provide for a simpler and more cost effective method of creating color photographs using black and white photographic film 100 as described herein, which uses panchromatic black and white photographic emulsion 102 and a color filter array 104, as compared to color photographs using conventional color photographic film.

Referring to FIG. 3A, in some embodiments, the color filter array 104 can be a structured or random array of color or wavelength sensitivity domains 108. The domains 108 can be any shape or any combination of additive primary colors such as red, green, blue or orange, green and purple, and/or can include ultraviolet and/or infrared domains that can be used to encode ultraviolet and/or infrared information in the photographic film. In one embodiment, the domains 108 are assembled much like a Bayer pattern color filter array of red, green and blue domains as known in the art. In some embodiments, the domains 108 may be arranged or assembled in a random distribution. The resolution of the image formed on the photographic film can be controlled by the size and spacing of the domains 108 on the color filter. As the size and or spacing between the color domains decreases, the resolution of the image formed on the photographic film can increase. Likewise, as the size and or spacing between the color domains increases, the resolution of the image formed on the photographic film can decrease.

As shown in FIG. 3B, in some embodiments, the domains 108 can be surrounded by a black border 110 to occlude non-image information from passing to the emulsion 102 without first passing through one of the filters in the color filter array 104.

As shown in FIG. 3C, in some embodiments, the domains 108 can be surrounded by a colored border 112 that is not black in order to change the color temperature of the image or mask the visibility of the image until a complementary colored filter 104 is placed in the optical path to reveal the image.

Referring to FIGS. 1A-B and FIGS. 3A-C, in some embodiments, the color filter array 104 can be permanently applied to the substrate 106. As one example, the color filter array 104 can be lithographically printed using permanent translucent dyes, or vacuum vapor deposition dichroic interference filter techniques, or a color photograph of the color filter array. As another example, the color filter array 104 can be deposited, formed on, or laminated to a surface of the substrate 106.

In some embodiments, the color filter array 104 can be applied to one surface of the substrate 106. In some embodiments, a black and white photographic emulsion 102 can be applied to an opposite side of the substrate material.

In one embodiment, a panchromatic black and white photographic emulsion 102 can be made from a non-panchromatic emulsion. As one example, a non-panchromatic black and white photographic emulsion can be disposed in a solution that attenuates blue and ultraviolet sensitivity and/or to equalize the sensitivity of the black and white photographic film to all wavelengths of visible light; thereby forming a panchromatic black and white photographic emulsion from a non-panchromatic emulsion. In some embodiments, by adding green and red dyes to a non-panchromatic emulsion, a panchromatic emulsion 102 can be created.

In one embodiment, the panchromatic black and white photographic emulsion 102 can be sensitive to ultraviolet wavelengths. Ultraviolet sensitive emulsion is that which is responsive, via the intrinsic nature of photosensitive silver halides, to the UV-blue spectral region. In one embodiment, the photographic emulsion 102 may be coated onto the color filter array 104 with domains 108 that can be sensitive to wavelengths of interest. In one embodiment, the domains 108 may be sensitive to wavelengths of interest by using dichromatic or other filters that can pass specific UV wavelengths and block wavelengths in the visible portion of the electromagnetic (EM) spectrum.

In one embodiment, the panchromatic black and white photographic emulsion 102 can be sensitive to infrared wavelengths. In one embodiment, the photographic emulsion 102 may be coated onto the color filter array 104 with domains 108 that can be sensitive to infrared wavelengths.

In some embodiments, once exposed, the latent image may be processed using a reversal process technique. The resultant image transparency may be aligned to the color filter array 104 of domains 108 in the visible portion of the EM spectrum such that the resultant observable image may represent a pseudo colored image representing the infrared wavelength components of the original captured image as depicted in FIG. 2.

In one embodiment, the photographic film 100 can be placed into a photographic film camera or other device to allow for the exposure of an image onto the panchromatic black and white photographic emulsion such that the color filter array faces the lens 112 of the camera as depicted in FIG. 1 and the image captured by the exposure is encoded in the panchromatic black and white photographic emulsion through the color domains of the color filter array 104.

In one embodiment, the color filter array 104 can be placed in a camera or other device and the photographic film 100 can be exposed to an image. The panchromatic black and white photographic emulsion 102 can have color domain information encoded therein from exposure to an image using a color filter array 104. The photographic film 100 can then be registered to a color filter array 104. When illuminated with a registered color filter array 104, the photographic film 100 can be seen as a full color image.

In one embodiment, inkjet printer technology can be used to create the color filter arrays 104 with the required spatial resolution applied to a selected transparent substrate, such as the substrate 106. That is, the inkjet head with appropriate specialized inks can advantageously deliver pico-liter droplets in a desired pattern. This provides a means to create filter arrays 104 as taught herein. Such filter arrays enable the customization of domains 108 inherent in their configuration. For example, such domains 108 may vary in shape, size, color, color density, distribution etc. in order to define specialized color filter applications to precisely match the intended imaging applications. Instances may be portraiture of human subjects (e.g., a "warm" filter characteristic) versus vivid outdoor photography (e.g., a "cool" filter characteristic) with appropriate gamma (e.g., contrast).

In addition to the creation of color filter arrays 104, the inkjet printer approach may also readily permit the application of various light sensitive emulsions directly onto previously created color filter arrays 104. As one example, the color filter array can be printed on one side of the substrate 106. This enables variants in the created photographic film in terms of useful interactions between emulsion spectral sensitivity and various color filter configurations.

In one embodiment, the utilization of polymeric "super absorbents," either hydrophilic or lipophilic, that can accept translucent dyes or pigments are applied to the creation of the subject color filter arrays 104. This approach differs from inkjet methodology in that a collection of colored suitably small spheroidal filter elements filters the color of the light to create a color filter array 104 as taught herein.

Figure 4:
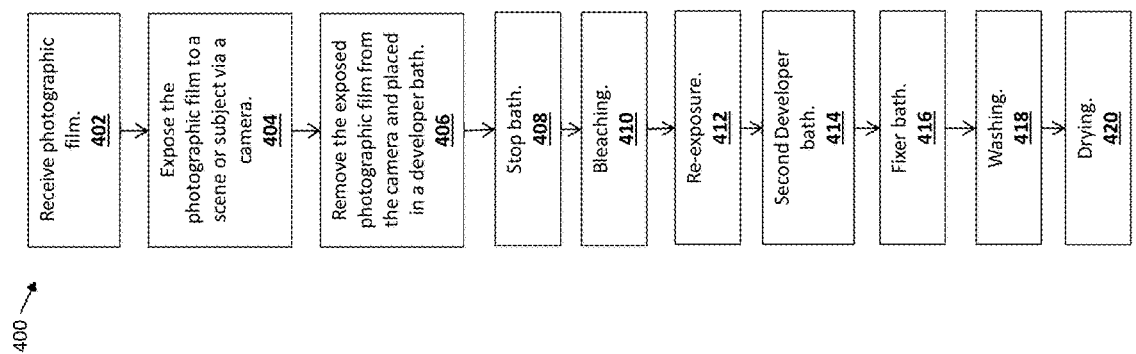
FIG. 4 is a flowchart illustrating a method of manufacturing a colored photographic image using a panchromatic black and white photographic emulsion in accordance with an exemplary embodiment of the present disclosure.

FIG. 4 illustrates a process 400 of forming a colored photographic image using black and white photographic film in accordance with embodiments of the present disclosure. At step 402, a photographic film (e.g., an embodiment of the photographic film 100) can be received. The photographic film can be a substrate (e.g., an embodiment of the substrate 106), which can be a flexible or rigid transparent plate-like structure having two side surfaces with generally equal surface areas and edges defining a perimeter of the substrate. A thickness of the substrate can be measured between the two side surfaces in a direction that is perpendicular to the side surfaces.

A color filter array (e.g., an embodiment of the color array 104) can be applied to the substrate. The color filter array can be applied to a first side of the substrate.

A panchromatic black and white photographic emulsion (e.g., an embodiment of the panchromatic black and white photographic emulsion 102) can be applied to a second side of the substrate opposite the first side upon which the color filter array is applied such that the substrate is disposed between the color filter array and the panchromatic black and white panchromatic black and white photographic emulsion. In some embodiments, the panchromatic black and white photographic emulsion may be sensitive to UV wavelengths.

At step 404, the photographic film (e.g., including the panchromatic or non-panchromatic black and white photographic emulsion), can be exposed to a scene or subject through a color filter array to form a latent image on the panchromatic black and white photographic emulsion that corresponds to the scene or subject. As an example, a lens of a camera can capture an image of a scene or subject and focus the image onto the panchromatic black and white photographic emulsion of the photographic film through the color filter array. The image can pass through the color filter array, which can separate the image information into separate channels of color information as described by the light wavelength bands of each of the primary color filters of the color filter array (e.g., red, blue, green, ultraviolet, infrared). The color encoded image can continue through the transparent substrate to the panchromatic black and white photographic emulsion to form a latent black and white image in the panchromatic black and white photographic emulsion that is spatially encoded with the color information of the image separated by the color domains of the color filter array.

At step 406, the photographic film can be removed from the camera (e.g., in the dark) and placed in a developer bath. In some embodiments, the developer bath may comprise a mixture of three main chemical components. In some embodiments, a developing agent, such as, for example, metol, phenidone, dimezone or hydroquinone, can be present. In some embodiments an alkaline agent, such as, for example sodium carbonate, borax, or sodium hydroxide, and sodium sulfite which may delay oxidation of the developing agents from atmospheric oxygen, can be present.

In some embodiments, the developer bath can convert the latent image formed in the panchromatic black and white photographic emulsion to microscopic particles of metallic silver.

At step 408, the photographic film can be placed in a stop bath. In some embodiments, the stop bath can comprise a dilute solution of acetic acid or citric acid, which can stop the action of the developing agents. In some embodiments, a rinse with clean water may be substituted for the acetic acid or citric acid. In some embodiments, a fixer bath may be used.

At step 410, the photographic film can be bleached to remove the developed negative image such that the photographic film contains a latent positive image formed from unexposed and undeveloped silver halide salts.

At step 412, the photographic film can be re-exposed to a light source.

At step 414, the photographic film can be placed in a second developer bath that can develop the remaining silver halide salts, converting them into a positive image. In some embodiments, the developer bath may comprise a mixture of three main chemical components. In some embodiments, a developing agent, such as for example, metol, phenidone, dimezone or hydroquinone, can be present. In some embodiments an alkaline agent, such as, for example, sodium carbonate, borax, or sodium hydroxide, and sodium sulfite which may delay oxidation of the developing agents from atmospheric oxygen, can be present. The developer bath can convert the latent image to macroscopic particles of metallic silver. In some embodiments, a stop bath may be used to stop the action of the developing agents.

At step 416, the photographic film can be placed in a fixer bath, which can make the image permanent and light-resistant by dissolving remaining silver halide in the panchromatic black and white photographic emulsion. In some embodiments, the fixer bath can comprise ammonium thiosulfate. In some embodiments, washing the image in clean water may remove any remaining fixer. In some embodiments, the washing time can be reduced and the fixer can be more completely removed if a hypo clearing agent is used.

At step 418, the substrate can be washed. In some embodiments, the substrate can be rinsed in a dilute solution of a non-ionic wetting agent to assist uniform drying, which can eliminate drying marks caused by hard water. In some embodiments, the substrate can be dried in a dust-free environment, cut and placed into protective sleeves.

At step 420, the substrate can be dried.

Once the substrate has been photographically processed as a positive transparency, the image can be viewed by holding the processed substrate up to a white light source or by projecting the image using a white light source (e.g., a projector). The resultant image on the processed black and white film can be in full color as illustrated in FIGS. 1 and 2. For embodiments in which the color filter array is separate from the substrate, the color filter array or an identical color filter array can be registered with the substrate to align the color filter array with the substrate so that the positions of the domains of the color filter array with respect to the substrate after processing match the positions of the domains of the color filter array during the exposure via the camera.

The invention claimed is:

1. A photographic film comprising;
    a color filter array comprising transparent color dye domains that pass at least one of ultraviolet wavelengths or infrared wavelengths of an electromagnetic (EM) spectrum and block wavelengths in a visible light portion of the EM spectrum; and
    a black and white photographic emulsion sensitive to the at least one of ultraviolet wavelengths or infrared wavelengths of the EM spectrum and overlaid by the color filter array.

2. The photographic film of claim 1, wherein the domains are arranged in a random distribution.

3. The photographic film of claim 1, wherein the domains are surrounded by a border.

4. The photographic film of claim 3, wherein the border is black.

5. The photographic film of claim 4, wherein the border is colored.

6. The photographic film of claim 1, wherein a transparent substrate is positioned between the black and white photographic emulsion and the color filter array, the black and white photographic emulsion being disposed on a first side of the transparent substrate and the color filter array being disposed on a second side of the transparent substrate.

7. The photographic film of claim 1, wherein the black and white photographic emulsion is a panchromatic black and white photographic emulsion.

8. The photographic film of claim 1, wherein the domains of the color filter array are configured to separate information of an image into separate channels of color information as described by light wavelength bands.

9. The photographic film of claim 8, wherein the panchromatic black and white photographic emulsion is configured to form a latent black and white image in the panchromatic black and white photographic emulsion that is chromatically encoded with the color information of the image separated by the domains of the color filter array.

10. The photographic film of claim 9, further comprising a second color filter array of colors in the visible light portion of the EM spectrum and having a same spatially organized color domains as the color filter array,
    wherein the second color filter array overlays the latent black and white image to create a pseudo color image.

* * * * *